US010227709B2

(12) United States Patent
Andreaco et al.

(10) Patent No.: US 10,227,709 B2
(45) Date of Patent: Mar. 12, 2019

(54) CRYSTAL GROWTH ATMOSPHERE FOR OXYORTHOSILICATE MATERIALS PRODUCTION

(71) Applicant: Siemens Medical Solutions USA, Inc., Malvern, PA (US)

(72) Inventors: Mark S. Andreaco, Knoxville, TN (US); Peter Carl Cohen, Knoxville, TN (US); Alexander Andrew Carey, Lenoir City, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 142 days.

(21) Appl. No.: 14/623,760

(22) Filed: Feb. 17, 2015

(65) Prior Publication Data
US 2015/0184312 A1 Jul. 2, 2015

Related U.S. Application Data

(62) Division of application No. 12/953,582, filed on Nov. 24, 2010, now abandoned.

(51) Int. Cl.
| | | |
|---|---|---|
| *C30B 15/04* | (2006.01) | |
| *C30B 15/02* | (2006.01) | |
| *C30B 29/34* | (2006.01) | |
| *C09K 11/77* | (2006.01) | |

(52) U.S. Cl.
CPC .......... *C30B 15/04* (2013.01); *C09K 11/7706* (2013.01); *C09K 11/7774* (2013.01); *C30B 15/02* (2013.01); *C30B 29/34* (2013.01)

(58) Field of Classification Search
CPC ......... C30B 15/00; C30B 15/02; C30B 15/04; C30B 15/14; C30B 15/20; C30B 29/00; C30B 29/10; C30B 29/34; C09K 11/7706; C09K 11/7774
USPC ...... 117/11, 13–15, 19–20, 35–36, 906, 937, 117/942
See application file for complete search history.

(56) References Cited

U.S. PATENT DOCUMENTS

| | | | |
|---|---|---|---|
| 4,415,401 A | 11/1983 | Wald et al. | |
| 4,443,411 A | 4/1984 | Kalejs | |
| 4,534,821 A | 8/1985 | Sakaguchi et al. | |
| 4,591,409 A * | 5/1986 | Ziem | ...................... C30B 15/04 117/19 |
| 5,131,974 A | 7/1992 | Oda et al. | |
| 5,164,041 A * | 11/1992 | Berkstresser | ........... C30B 15/00 117/19 |

(Continued)

FOREIGN PATENT DOCUMENTS

| | | |
|---|---|---|
| CN | 1250526 A | 4/2000 |
| CN | 102443844 A | 5/2012 |

OTHER PUBLICATIONS

Office Action dated Jun. 30, 2015 in CN Application No. 20110378005. 4, 13 pages, English translation attached.

(Continued)

*Primary Examiner* — Kenneth A Bratland, Jr.

(57) ABSTRACT

A method of growing a rare-earth oxyorthosilicate crystal, and crystals grown using the method are disclosed. The method includes preparing a melt by melting a first substance including at least one first rare-earth element and providing an atmosphere that includes an inert gas and a gas including oxygen.

10 Claims, 5 Drawing Sheets

(56) References Cited

U.S. PATENT DOCUMENTS

| | | | |
|---|---|---|---|
| 6,278,832 B1 * | 8/2001 | Zagumennyi | C09K 11/7774 |
| | | | 117/12 |
| 6,303,048 B1 | 10/2001 | Kawanaka et al. | |
| 6,514,336 B1 * | 2/2003 | Zavartsev | C30B 15/00 |
| | | | 117/13 |
| 6,997,986 B2 | 2/2006 | Sato | |
| 7,264,750 B2 | 9/2007 | Kurashige et al. | |
| 7,297,954 B2 | 11/2007 | Kurashige et al. | |
| 7,618,491 B2 | 11/2009 | Kurata et al. | |
| 8,278,624 B2 | 10/2012 | Koschan et al. | |
| 2003/0159643 A1 | 8/2003 | Sumiya et al. | |
| 2004/0149201 A1 | 8/2004 | Sato | |
| 2006/0266276 A1 * | 11/2006 | Shimura | C30B 29/34 |
| | | | 117/19 |
| 2006/0266277 A1 | 11/2006 | Usui et al. | |
| 2006/0266945 A1 * | 11/2006 | Kurashige | C09K 11/7774 |
| | | | 250/361 R |
| 2007/0277726 A1 | 12/2007 | Usui et al. | |
| 2007/0292330 A1 | 12/2007 | Kurata et al. | |

OTHER PUBLICATIONS

Hoshino, T., et al., "Determination of the Thermal Conductivity of Argon and Nitrogen over a Wide Temperature Range Through Data Evaluation and Shock-Tube Experiments," International Journal of Thermophysics, vol. 7, No. 3, pp. 647-662, 1986.

* cited by examiner

CRYSTAL GROWTH ATMOSPHERE FOR OXYORTHOSILICATE MATERIALS PRODUCTION

This application is a divisional application of U.S. patent application Ser. No. 12/953,582, filed Nov. 24, 2010, which application is incorporated herein by reference in its entirety.

FIELD OF INVENTION

This application relates to the growth of crystals.

BACKGROUND

In some methods for growing crystals, such as the Czochralski method, a seed crystal is brought into contact with the surface of a melt and then withdrawn from the melt. A crystal grows on the seed as it is withdrawn. The seed and growing crystal are sometimes also rotated about a vertical axis as they are withdrawn. Growth instabilities often occur in large crystals grown using this technique. As an example, the crystal may begin to grow in a spiral shape instead of a desired cylindrical shape. Growth instabilities may result in stresses due to variations in thermal expansion coefficients within the crystal, which may cause the crystal to shatter. This shattering is more likely when significant temperature gradients are present in the melt and in the atmosphere above the melt in which the crystal grows.

Growth instabilities may be caused by sufficiently large temperature gradients, accumulation of impurities in the melt, changes in the charge states of some of the melt constituents leading to creation of different molecular complexes, as well as by excesses of melt constituents accumulating at the interface between the surface of the melt and the growing crystal.

In the growth o f rare-earth oxyortho silicate scintillator crystals, oxygen vacancies in the crystal lattice may act as charge traps that lower the amount of charge carriers (electrons and holes) generated when the crystal absorbs ionizing radiation. The results are a lowering of scintillation efficiency and an undesirable persistent emission of light from the crystal known as afterglow. Reducing concentration of such oxygen vacancies is therefore desirable. This has been partially achieved by annealing the grown crystal in an oxygen-containing atmosphere. This is an extra step in the preparation of such crystals.

SUMMARY

A method of growing rare-earth oxyorthosilicate crystals and the crystals grown with the method are disclosed. The method includes providing an atmosphere for crystal growth including an inert gas and a gas including oxygen.

According to one aspect of the present disclosure, an oxyorthosilicate scintillator crystal comprises an oxyorthosilicate of at least one first rare-earth element, such as lutetium, and further comprising at least one of: a group 2 element, a group 3 element, a group 6 element, or a group 7 element, the crystal being grown from a melt in an atmosphere comprising an inert gas and a gas including oxygen. In one example, the inert gas has a thermal conductivity less than or equal to 150 mW/m-° K at the temperature used during crystal growth. In another example, the gas including oxygen comprises at least one of carbon dioxide, carbon monoxide, or oxygen. In another example, the atmosphere comprises 0.01-10 percent oxygen by volume, inclusive. In other examples, the atmosphere comprises less than 300 parts per million of oxygen or less than 200 parts per million of oxygen. The inert gas can comprise at least one of helium, argon, krypton, or xenon. The inert gas can also comprise nitrogen. The scintillator crystal can further comprising a second rare earth element, such as cerium, incorporated as a dopant.

According to another aspect of the present disclosure, a scintillator crystal comprises an oxyorthosilicate of at least one first rare-earth element, such as lutetium, the crystal being grown from a melt in an atmosphere, the atmosphere comprising an inert gas and less than less than 300 ppm oxygen. In one example, the inert gas has a thermal conductivity less than or equal to 150 m/Wm-° K at the temperature used during crystal growth. In another example, the scintillator crystal further comprises a second rare-earth element, such as cerium, incorporated as a dopant.

DETAILED DESCRIPTION

Figure 1:
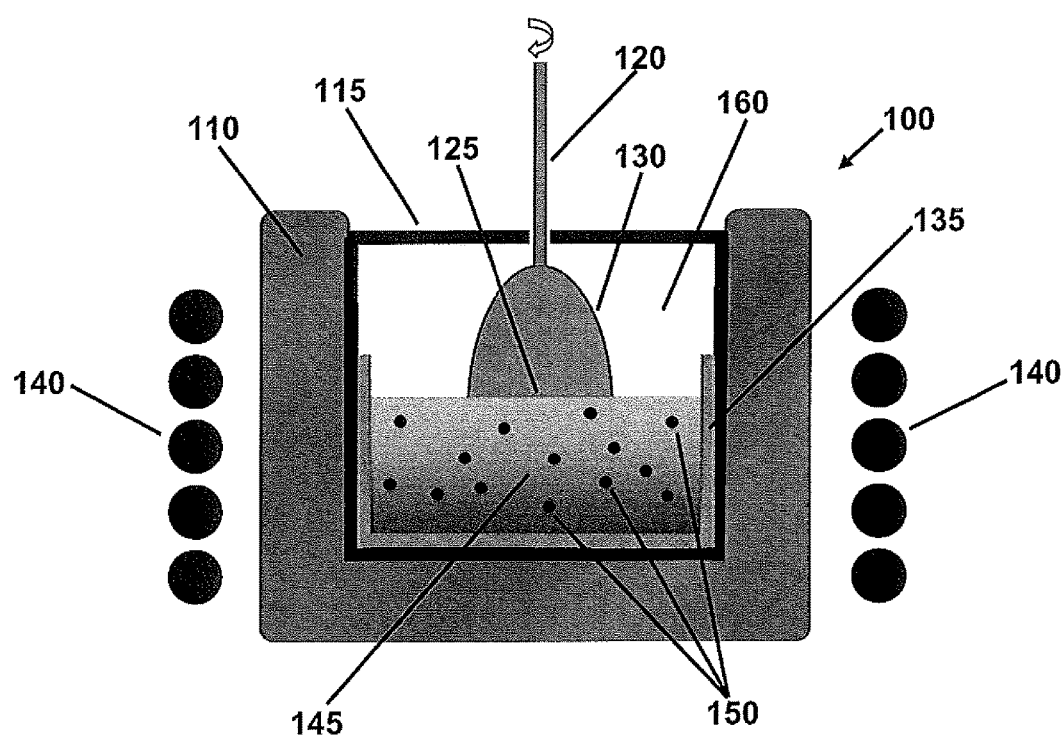
FIG. 1 shows an example apparatus for growing a crystal.

Control of the atmosphere above a melt during crystal growth using a method such as the Czochralski method may be crucial for controlling growth stability and controlling properties of the grown crystal. In particular, in the growth of rare-earth oxyorthosilicate scintillator crystals, careful control of the atmosphere and the melt composition may simultaneously minimize at least three problems in the growth of these crystals.

A first problem is the inclusion of oxygen vacancies in the grown crystal, which reduce the scintillation efficiency of the crystal and give rise to an undesirable persistent emission of light from the crystal known as afterglow. These oxygen vacancies may arise from a deficiency of oxygen during crystal growth. Rare-earth oxyorthosilicate scintillator crystals may be grown from a melt prepared by melting a rare-earth compound, such as an oxide, with a silicon oxide, such as $SiO_2$. Temperatures of 2000° C. or higher may be needed to melt these substances. At these temperatures it may be desirable to use a nearly inert atmosphere to prevent introducing impurities into the melt. If a pure inert atmosphere is used, however, the $SiO_2$ may decompose into SiO (silicon monoxide) and oxygen. The result is a change in the stoichiometry of the grown crystal and the introduction of the undesirable oxygen vacancies. It has been found that introducing an oxygen containing species, such as carbon dioxide ($CO_2$), carbon monoxide (CO), or oxygen ($O_2$) into the atmosphere may reduce the concentration of the oxygen vacancies in the crystal and thereby achieve desired scintillation performance without a need for the above described post-growth anneal. Other gases that may decompose and liberate elemental oxygen include, as examples, sulfur trioxide ($SO_3$), several different oxides of nitrogen $NO_2$, $N_2O$, NO, $N_2O_3$, $N_2O_5$ and phosphorous pentoxide $P_2O_5$. However, except for nitrous oxide $N_2O$, these gasses are more reactive than $CO_2$ with materials making up the interior of the furnace.

At the same time, the amount of oxygen introduced into the atmosphere must be kept low enough to avoid appreciable oxidation of materials used in the growth apparatus, such as the iridium and iridium alloys of the crucible, often used to contain the melt for the growth of these crystals. Oxidation of an iridium crucible may introduce contaminants into the melt and shorten the usable lifetime of the expensive iridium crucible. Thus, the amount of oxygen introduced must be carefully chosen.

A second problem with these crystals is cracking of the crystal during growth, which may result from excessive temperature gradients in growth chamber. This problem may be addressed by reducing the thermal conductivity of the growth atmosphere. Thermal conductivity contributes to the thermal diffusivity, which determines how rapidly any temperature change diffuses through an atmosphere. Lower thermal conductivity results in greater stability of temperature gradients in the growth chamber, isolating a crystal boule from any fluctuation in temperature in the surrounding environment.

At the same time, it may be desirable to control temperature gradients in the melt that stimulate the oxygen transport in the crystal-melt interface. One way benefits may occur is through the phenomenon known as Marangoni flow, a type of fluid flow driven by gradients in surface tension. The surface tension gradients may, in turn, be produced by increasing the temperature gradients in the melt surface.

A third problem arises in the growth of these crystals, in particular with cerium-doped lutetium oxyorthosilicate scintillator crystals. If grown as described above in an oxygen-containing atmosphere, some of the cerium in the crystal may undergo a change of oxidization state, from the desired 3+ state to a 4+ state. The result is a yellowing of the crystal, which adversely affects the scintillation performance of the crystal, while reducing optical clarity. It has been found that adding to the melt at least one element from group 2, group 3, group 6, or group 7 of the periodic table in any combination will effectively eliminate this yellowing. It has also been found that the adding at least one such element further stabilizes the growth of the crystal, preventing such instabilities as spiral structures and other departures from cylindrical growth. Group 2 elements include beryllium (Be), magnesium (Mg), calcium (Ca), strontium (Sr) and barium (Ba). Group three elements include scandium and yttrium. Group 6 elements include chromium (Cr), molybdenum (Mo), and tungsten (W). Group 7 elements include manganese (Mn) and rhenium (Re). By careful choice and control of growth atmosphere and melt composition, therefore, both physical stability and composition of the crystal may be controlled to achieve multiple desirable results.

FIG. 1 shows an embodiment of a crystal-growing apparatus 100 including a melt 145. Melt 145 may be made by melting a first substance that includes at least one first rare-earth element, and a second substance that includes at least one element 150 from group 2, group 3, group 6, or group 7. Alternatively, at least one rare-earth element and at least one element from group 2, group 3, group 6, or group 7, may both be included in one substance. The first substance may be an oxide of the first rare-earth element. Melt 145 may also include melted stoichiometric $SiO_2$ (silica). Melt 145 may also include a melted third substance that includes a second rare-earth element distinct from the first rare-earth element.

Melt 145 may be contained in a crucible 135, which may be made of iridium. Crucible 135 is contained in an enclosure 115. Enclosure 115 may be utilized to control an ambient atmosphere 160 above the melt surface in which a rare-earth oxyorthosilicate crystal is growing as a crystal boule 130. Surrounding enclosure 115 is a thermally insulating material 110. Melt 145 is maintained in a molten state by inductive heating of crucible 135, the heating produced by RF induction coil 140. Crystal boule 130 grows at or near an interface 125 between a portion of the boule that is already grown and a surface of melt 145. Growth of crystal boule 130 is initiated by attaching a seed crystal (not shown) to a rod 120. Rod 120 is slowly lifted upward as crystal growth proceeds. Rod 120 may also be rotated, as indicated by an arrow. Although the arrow indicates rotation of rod 120 in a clockwise direction as seen from above, rod 120 may also be rotated counterclockwise as seen from above.

Melt 145 may include a melted third substance that includes a second rare-earth element. The second rare-earth element may be, but is not limited to, cerium (Ce). The second rare-earth element may be incorporated into crystal boule 130. The second rare-earth element may be incorporated into crystal boule 130 as a dopant. It may be incorporated as a substitutional dopant in the lattice of crystal boule 130. For example, a dopant atom of Ce may occupy a lattice position normally occupied by an Lu atom in a crystalline lattice of lutetium oxyorthosilicate.

Atmosphere 160 comprises at least one inert gas and at least one gaseous substance that includes oxygen. Atmosphere 160 is in contact with a surface of melt 145. As explained above, it may be desirable to use an inert gas with a lower thermal conductivity. The inert gas may comprise at least one of helium (He), argon (Ar), krypton (Kr), xenon (Xe), or nitrogen. If maintaining thermal gradients is less crucial, nitrogen, having a higher thermal conductivity, may be used. Thermal conductivity of the inert gas may be less than or equal to 150 mW/m-° K (milliwatts per meter-° K) at the temperature of the atmosphere during crystal growth. For example, the thermal conductivity of nitrogen at 2000° C. has been measured to be between about 70 and about 125 mW/m-° K, and the thermal conductivity of argon at 2000° C. has been measured to be between about 80 and about 100 mWm-° K.

The gaseous substance including oxygen may include carbon dioxide, which may disassociate to carbon monoxide and additional oxygen. The gaseous substance including oxygen may include other oxygen-containing compounds that disassociate to oxygen, such as carbon monoxide, oxygen, sulfur trioxide ($SO_3$), phosphorous pentoxide ($P_2O_5$)) or an oxide of nitrogen, all of these in any combination. The oxide of nitrogen may include $NO_2$, $N_2O$, NO, $N_2O_3$, or $N_2O_5$ in any combination. Atmosphere 160 may comprise from 100 parts per million (ppm) to 100000 ppm (0.01 to 10 percent) of oxygen by volume, inclusive. Alternatively, atmosphere 160 may comprise oxygen by volume in a range between and including any two integer values of ppm between 100 and 100000. In particular, atmosphere 160 may contain less than 300 ppm oxygen by volume. In particular, atmosphere 160 may contain less than 200 ppm oxygen by volume.

Figure 2:
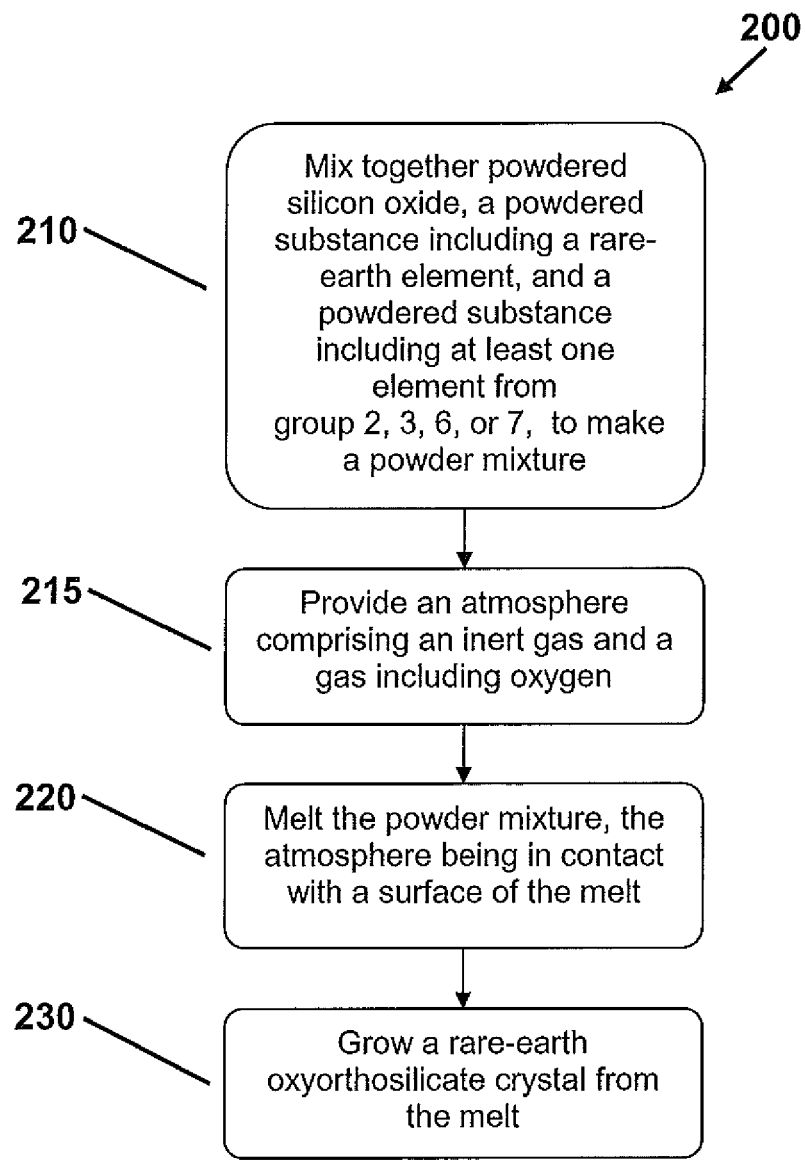
FIG. 2 is an example flow chart showing a method for growing a crystal.

FIG. 2 shows a first embodiment of a method (200) of growing a rare-earth oxyorthosilicate crystal in a controlled atmosphere. As illustrated in FIG. 2, a powdered substance comprising at least one first rare-earth element may be mixed with a powdered silicon oxide such as silica ($SiO_2$) 210. A powdered substance that includes at least one element from group 2, 3, 6, or 7 is added to make a powder mixture 210. The powdered substance comprising at least one first rare-earth element may be a rare-earth oxide or a mixture of such oxides, such as $Lu_2O_3$, $Gd_2O_3$, or $La_2O_3$, or a mixture thereof. An oxide of an additional element, such as $Y_2O_3$, may also be added 210. The group 7 element may be, but is not limited to, manganese or rhenium. In addition, one or more substances including at least one element from group 2 of the periodic table may be introduced into the mixture at step 210. The addition of group 2 elements may contribute stabilizing growth of the crystal. A second powdered substance comprising a second rare-earth element maybe mixed with the powder mixture at step 210. The second powdered substance may be a rare-earth oxide or any rare-earth compound including an oxygen moiety. As an example, a powdered substance including cerium, such as a cerium oxide $CeO_2$ may be introduced into the powder mixture for the purpose of growing an oxyorthosilicate crystal doped with cerium as a scintillator crystal.

In step 215 an atmosphere, 160 in FIG. 1, is provided comprising an inert gas and a gas including oxygen, as described above.

In step 220 the powder mixture is melted in crucible 135 to produce melt 145, atmosphere 160 being in contact with a surface of the melt. In step 230 a rare-earth oxyorthosilicate crystal is grown from melt 145 in the presence of atmosphere 160.

Figure 5:
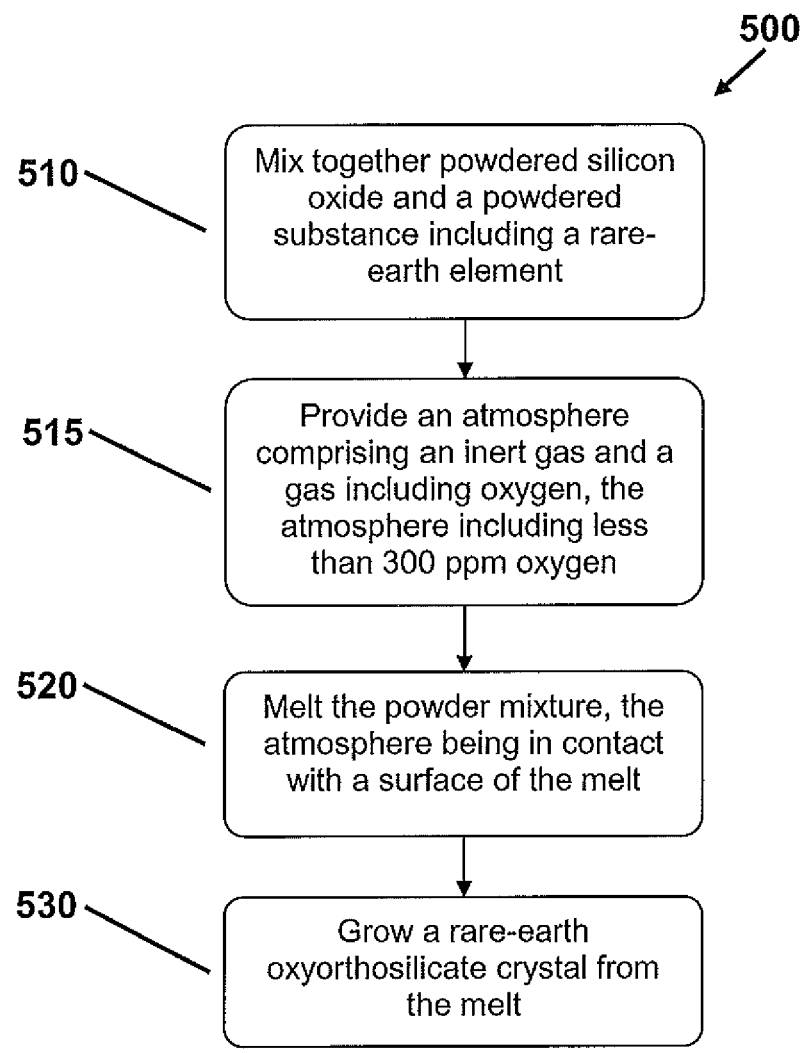
FIG. 5 is an example flow chart showing another method for growing a crystal.

FIG. 5 shows a second embodiment of a method (500) of growing a rare-earth oxyorthosilicate crystal in a controlled atmosphere. A powdered substance comprising a first rare-earth element may be mixed with a powdered silicon oxide such as silica ($SiO_2$) 510. A second powdered substance comprising a second rare-earth element may be mixed with the powder mixture at step 510. The second powdered substance may be a rare-earth oxide or any rare-earth compound including an oxygen moiety. As an example, a powdered substance including cerium, such as a cerium oxide $CeO_2$, or any other material that can be calcined to cerium oxide, may be introduced into the powder mixture for the purpose of growing an oxyorthosilicate crystal doped with cerium as a scintillator crystal.

In step 515 an atmosphere, 160 in FIG. 1, is provided comprising an inert gas and a gas including oxygen, or a compound that disassociates to oxygen, such that the atmosphere includes less than 300 ppm oxygen.

In step 520 the powder mixture is melted in crucible 135 to produce melt 145, atmosphere 160 being in contact with a surface of the melt. In step 230 a rare-earth oxyorthosilicate crystal is grown from melt 145 in the presence of atmosphere 160.

The embodiments illustrated in FIGS. 2 and 5 include the use of powders for the silicon oxide, for a substance comprising at least one first rare-earth element, for a substance comprising at least one element from group 2, 3, 6, or 7, and, optionally, a substance comprising at least one second rare-earth element. Another embodiment includes use of different forms of matter for some or all of these example substances, including, but not limited to, liquids, sintered substances, granulated substances, pressed tablets, or solids that are not powdered.

Figure 3:
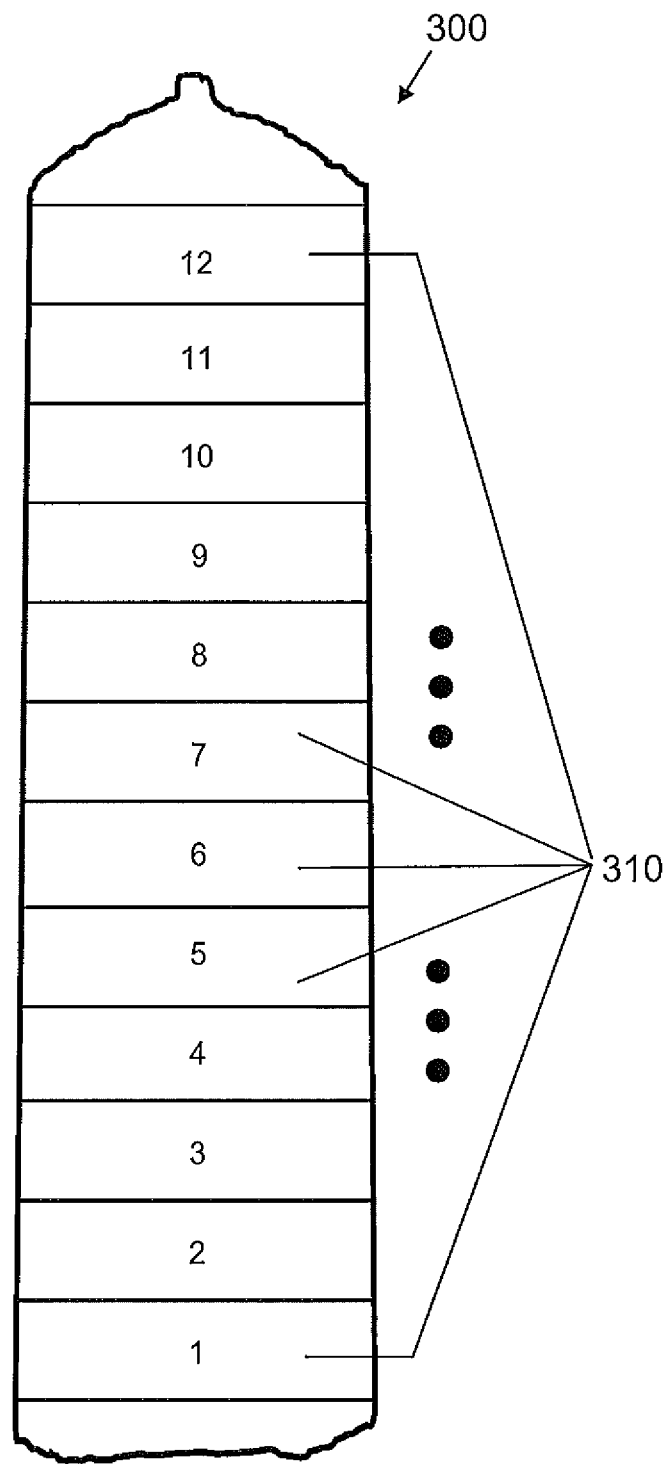
FIG. 3 shows an example crystal boule.

FIG. 3 shows an example of a crystal boule 300 grown according to a method described above. To evaluate the scintillation properties of crystals made by the methods illustrated in FIG. 2 or 3, boules were cut into multiple samples (slabs) and each sample was evaluated separately. FIG. 3 shows a boule cut into twelve samples 310. Sample 1 is taken from the bottom of the boule, that is, the last part of the boule to be grown. Sample 12 is taken from the top of the boule, that is, the first section to be grown.

Oxyorthosilicate crystals may be grown over the following ranges of conditions: temperature from 1900° C. to 2200° C. inclusive, withdrawal rates from 0.001 mm/hr to 10 mm/hr inclusive, and rotation rates from 0 to 100 rotations per minute (RPM), inclusive. These ranges are exemplary and under the methods described herein any one or more of these conditions maybe varied within or outside these ranges as known in the art. Oxyorthosilicate crystals may be grown over ranges of temperature, withdrawal rate, and rotation rate that are restricted to being between any two integer values, and including those integer values, within the above ranges. Exemplary cerium-doped lutetium oxyorthosilicate scintillator crystal boules were grown according to an embodiment of the method described above. The crystals were grown in an atmosphere including argon and $CO_2$. The crystals were grown to about 80 mm in diameter and about 240 mm in length. Slabs 20 mm in thickness were cut from the crystals and numbered, starting from the bottom section of the crystal boule as shown in FIG. 3. Light output measurements were done under excitation with $Cs^{137}$ gamma source (662 keV). The scintillation light was collected using a Hamamatsu R877 photomultiplier.

Table 1 shows light output, energy resolution, and decay time of a scintillator crystal grown in an atmosphere as described above. Results are presented in Table 1 using arbitrary scales defined by numbers of channels of a Multichannel Analyzer (MCA) unit used in the measurements. A bismuth germinate crystal ($Bi_4Ge_2O_{12}$; BGO) was used as a reference. (BGO photopeak was set to the channel 100 position).

TABLE 1

| Slab # | Thickness [mm] | Light Output [Ch MCA]* | ER [%] | Decay Time [ns] |
|---|---|---|---|---|
| 1 | 20 | 594 | 13 | 45.2 |
| 2 | 20 | 590 | 12 | 45.3 |
| 3 | 20 | 605 | 12 | 45.8 |
| 4 | 20 | 642 | 13 | 45.9 |
| 5 | 20 | 640 | 11 | 46.7 |
| 6 | 20 | 634 | 11 | 46.5 |
| 7 | 20 | 634 | 12 | 47.3 |
| 8 | 20 | 642 | 10 | 47.0 |
| 9 | 20 | 646 | 11 | 47.2 |
| 10 | 20 | 640 | 11 | 47.0 |
| 11 | 20 | 645 | 11 | 46.9 |
| 12 | 20 | 626 | 11 | 46.4 |
| 13 | 20 | 612 | 12 | 45.5 |

Results shown in Table 1 are characteristic of rare-earth oxyorthosilicate scintillator crystals of the highest optical quality and efficiency. As pointed out above, this has been achieved without any post growth anneal.

Figure 4:
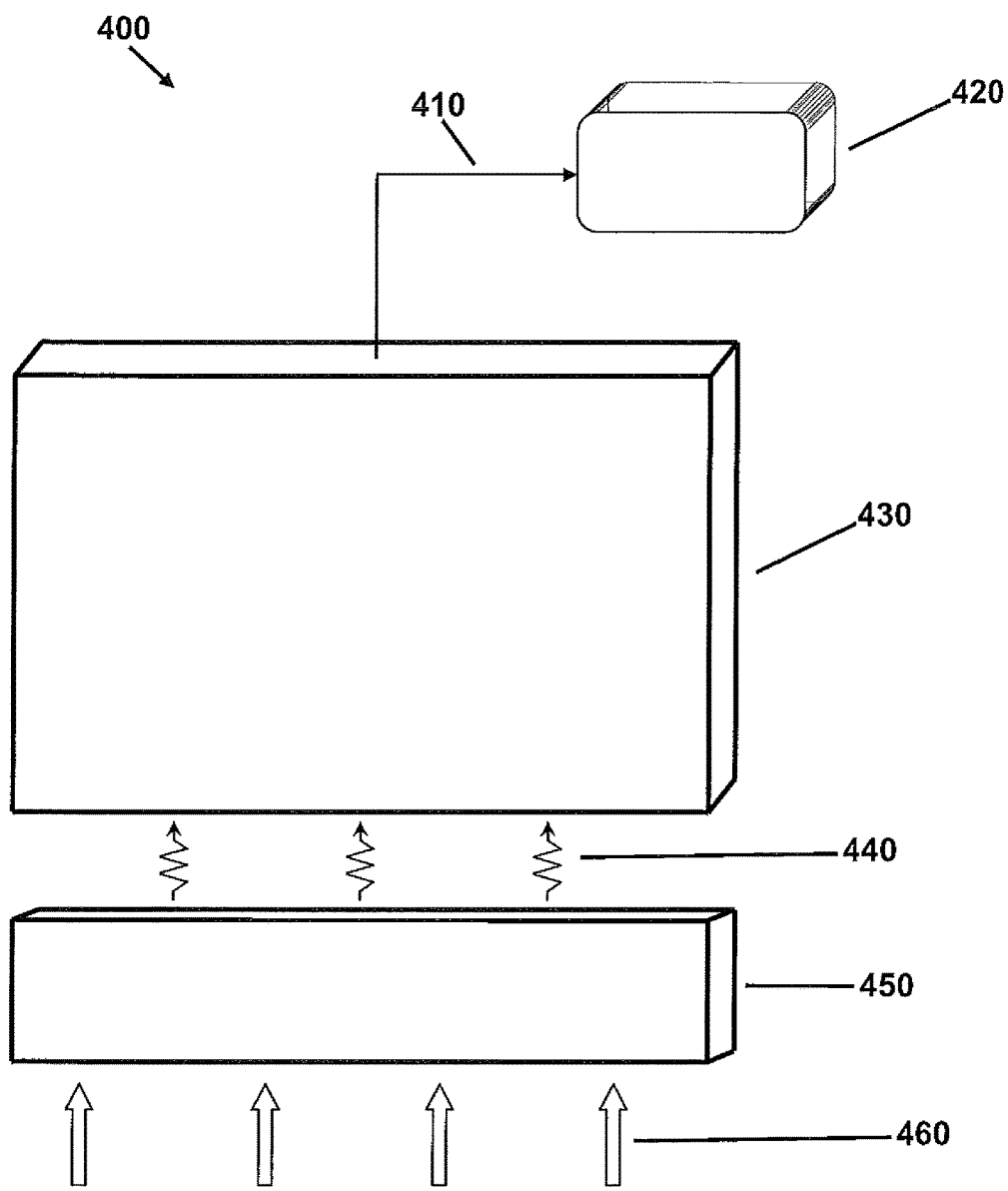
FIG. 4 shows an example of a scintillation counter.

FIG. 4 shows a scintillation counter 400 using as a detector a rare-earth oxyorthosilicate crystal 450 grown according to the method described above. Radiation 460, such as gamma photons, are absorbed by oxyorthosilicate crystal 450, resulting in emission of scintillation light 440 from oxyorthosilicate crystal 450. Scintillation light 440 is detected by light detector 430, such as a photomultiplier tube, avalanche photodiode, or any other light sensor. An electrical signal produced by light detector 430 is conveyed by electrical connection 410 to analyzing electronics 420. Information such as energy spectra and timing of radiation 460 may be extracted using analyzing electronics 420.

While the preceding description refers to certain embodiments, it should be recognized that the description is not limited to those embodiments. Rather, many modifications and variations may occur to a person of ordinary skill in the art which would not depart from the scope and spirit defined in the appended claims.

What is claimed is:

1. A method of growing a rare-earth oxyorthosilicate crystal, comprising:
    preparing a melt by melting a first substance comprising at least one first rare-earth element; and
    melting at least one of: a substance comprising a group 2 element, a substance comprising a group 3 element; a substance comprising a group 6 element, and a substance comprising a group 7 element;
    providing a surface of the melt with an atmosphere comprising an inert gas and an oxygen-containing compound that disassociates to oxygen; where the oxygen-containing compound is selected from carbon dioxide, carbon monoxide, sulfur trioxide, phosphorus pentoxide, $NO_2$, $N_2O$, NO, $N_2O_3$, $N_2O_5$, or a combination thereof; and where the oxygen derived from the disassociation of the oxygen-containing compound is present in the atmosphere in an amount of at least 100 parts per million but less than 300 parts per million;
    contacting the surface of the melt with a seed crystal; and
    growing a colorless oxyorthosilicate single crystal from the melt by withdrawing the seed crystal from the melt.

2. The method of claim 1, wherein the inert gas has a thermal conductivity less than or equal to 150 mW/m-° K at the temperature used during crystal growth.

3. The method of claim 1, wherein the inert gas comprises at least one of helium, argon, krypton, or xenon.

4. The method of claim 1, wherein the inert gas comprises nitrogen.

5. The method of claim 1, wherein preparing a melt further comprises melting a second substance comprising a second rare-earth element, the second rare-earth element being incorporated into the rare-earth oxyorthosilicate crystal as a dopant.

6. The method of claim 5, wherein the second rare-earth element is cerium.

7. The method of claim 1, wherein the first rare-earth element is lutetium, and growing an oxyorthosilicate single crystal comprises growing a lutetium oxyorthosilicate single crystal.

8. A method of making a single crystalline oxyorthosilicate scintillator material, the material comprising:
    preparing a starting material comprising a rare-earth element, a codopant comprising at least one of a group 2 element, a group 3 element; where the group 3 element is scandium, a group 6 element and a group 7 element, an activator, silicon and oxygen; and
    forming a colorless single crystal of an oxyorthosilicate of the first rare-earth element and doped with the activator from the starting material in an atmosphere comprising an inert gas and an oxygen-containing compound that disassociates to oxygen; where the oxygen-containing compound is selected from carbon dioxide, carbon monoxide, sulfur trioxide, phosphorus pentoxide, $NO_2$, $N_2O$, NO, $N_2O_3$, $N_2O_5$, or a combination thereof; and where the oxygen derived from the disassociation of the oxygen-containing compound is present in the atmosphere in an amount of at least 100 parts per million but less than 300 parts per million.

9. The method of claim 8, wherein preparing a starting material comprises making melt of the starting material, and wherein forming a single comprises growing a single crystal from the melt.

10. The method of claim 8, wherein the rare-earth element comprises lutetium and the activator is cerium.

* * * * *